United States Patent [19]

Thane et al.

[11] Patent Number: 5,366,848
[45] Date of Patent: Nov. 22, 1994

[54] METHOD OF PRODUCING SUBMICRON CONTACTS WITH UNIQUE ETCHED SLOPES

[75] Inventors: Nathan Thane, Austin, Tex.; William Hata, Milpitas, Calif.

[73] Assignee: SGS-Thomson Microelectronics, Inc., Carrollton, Tex.

[21] Appl. No.: 41,524

[22] Filed: Apr. 1, 1993

Related U.S. Application Data

[63] Continuation of Ser. No. 682,568, Apr. 9, 1991, abandoned.

[51] Int. Cl.$^5$ ............................................... G03C 5/00
[52] U.S. Cl. ................................ 430/313; 430/314; 430/317; 156/644; 156/659.1; 156/661.1
[58] Field of Search ............ 430/311, 312, 316, 317, 430/319, 320, 313, 314; 156/625, 644, 659.1, 661.1

[56] References Cited

U.S. PATENT DOCUMENTS

| | | | |
|---|---|---|---|
| 3,518,084 | 6/1970 | Barson | 430/314 |
| 3,873,361 | 3/1975 | Franco et al. | 430/324 |
| 4,501,547 | 5/1986 | Brownell | 430/314 |
| 4,694,565 | 9/1987 | Custode | 437/34 |

FOREIGN PATENT DOCUMENTS 0200525 11/1986 European Pat. Off. .

OTHER PUBLICATIONS

"Use of Ultra-Thin Layers of Spun on Resist to Product Sidewall Spacer and/or Enhance Sidewall Sloping" IBM Technical Disclosure Bulletin, vol. 31, No. 7, Dec. 1988.

Reichmanis, et al., "Approaches to Resists for Two-Level RIE Pattern Transfer Applications", Solid State Technology/Aug. 1985, pp. 130–135.

Ong, et al., "Multilayer Resists for Fine Line Optical Lithography", Solid State Technology/Jun. 1984, pp. 155–160.

Roland, R. et al., "The Mechanism of the Desired Process", *Advances in Resist Technology and Processing IV*, vol. 771, (SPIE, 1987), pp. 69–76.

*Primary Examiner*—Marion E. McCamish
*Assistant Examiner*—Kathleen Duda
*Attorney, Agent, or Firm*—Kenneth C. Hill; Lisa K. Jorgenson; Richard K. Robinson

[57] ABSTRACT

A method is provided for making submicron contact openings by forming an insulating layer over a substrate and a photoresist layer over the insulating layer. The thick photoresist layer is patterned and etched to form a first opening in the photoresist. A thin photoresist layer is then formed over the integrated circuit which is then patterned and etched to form a second opening inside the first opening. A contact opening is then etched through the insulating layer through the second opening in the thin photoresist.

7 Claims, 2 Drawing Sheets

METHOD OF PRODUCING SUBMICRON CONTACTS WITH UNIQUE ETCHED SLOPES

This is a continuation, of application Ser. No. 07/682,568, filed Apr. 9, 1991, now abandoned.

FIELD OF THE INVENTION

The present invention relates generally to semiconductor integrated circuit processing, and more specifically to producing submicron contacts with unique etched slopes.

BACKGROUND OF THE INVENTION

With the trend to continue to miniaturize semiconductor integrated circuits to achieve submicron feature sizes, photolithography has become one of the most critical steps in semiconductor manufacturing. The goal of photolithography in establishing the horizontal dimensions of the various devices and circuits is to create a pattern which meets design requirements as well as to correctly align the circuit pattern on the surface of the wafer.

As line widths shrink smaller and smaller in submicron photolithography, the process to print lines and contact holes in photoresist becomes increasingly more difficult. Photoresists have been developed to keep pace with the industry's need to print narrower lines with fewer defects. The selection of the photoresist must be made on whether the photoresist has the capability of producing the design dimensions. A thinner resist layer will generally produce narrower lines. However, the resist must simultaneously be thick enough to act as an etchant barrier and be free of pinholes.

Exposure light sources are chosen in photolithography based upon the characteristics of the photoresist. Standard production exposure tools used to print contact holes may limit how small the holes can be made. One problem with standard exposure tools is in the auto focus mechanism used to pattern a wafer. The exposure tools, when used in conjunction with thick photoresists have a small depth of focus so that light focused on the top of the photoresist will be out of focus near the bottom of the photoresist.

Production tools with light sources having longer wavelengths also create negative optical effects such as diffraction. Diffraction reduces the resolution of an image in the photoresist causing poor image definition. Image resolution, known as latent image decay, may also be reduced through the addition of chemicals to the photoresist.

The focus problem of standard production exposure tools causes poor control of the pattern imaged into the photoresist and the light needed to expose the photoresist at the bottom of the contact hole nearest the wafer. An increase in the exposure light dose to overcome this focus problem allows incident light to expose areas of the photoresist that are not targeted for exposure. Any increase in exposure time to compensate for the focus problem cannot control the incident light, resulting in poor photoresist sidewall profiles. These profiles generally result in an opening too large at the top of the photoresist causing poor circuit overlay to the underlying wafer.

An additional concern in printing submicron contacts is the resultant angle of the step from the top of the photoresist to the bottom of the contact hole. If the angle is too steep, subsequently deposited metal may be too thin over the step. One solution to this problem is to do a wet etch followed by a dry etch to achieve sloped sidewalls at the top of contact openings. Wet etches, however, have been limited to feature sizes greater than 3 microns.

It would be desirable to provide a method for printing small contact holes using a thin photoresist while protecting the integrated circuit during the etching process. It would be further desirable for such fabrication technique to provide unique etched contact profiles for use with small device geometries using dry etch techniques. It would be further desirable for such method to be compatible with current process technologies.

SUMMARY OF THE INVENTION

It is therefore an object of the present invention to provide a semiconductor fabrication technique which uses a thin layer of photoresist for printing small contacts while protecting the wafer during etch.

It is a further object of the present invention to provide such a semiconductor fabrication technique which provides unique etched contact profiles for use with small device geometries.

It is yet another object of the present invention to provide a semiconductor fabrication technique which controls imaging thereby producing smaller contact dimensions.

It is still another object of the present invention to provide such a semiconductor fabrication process which is easily adapted for use with standard integrated circuit fabrication process flows.

Therefore, according to the present invention, submicron contact openings are made by forming an insulating layer over a substrate and a photoresist layer over the insulating layer. The thick photoresist layer is patterned and etched to form a first opening in the photoresist. A thin photoresist layer is then formed over the integrated circuit which is then patterned and etched to form a second opening inside the first opening. A contact opening is then etched through the insulating layer through the second opening in the thin photoresist.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
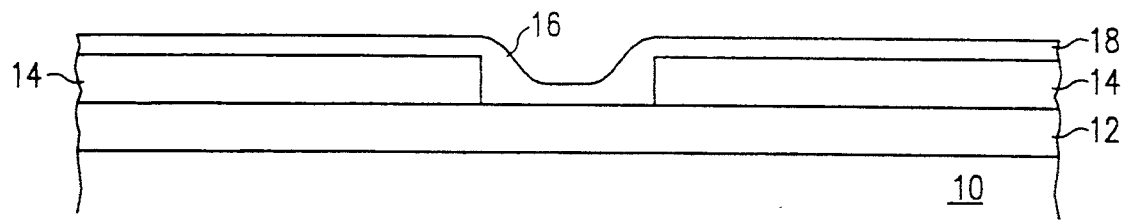
FIGS. 1-8 illustrate a preferred method for forming integrated circuit structures according to the present invention; and, FIG. 9 illustrates a portion of an integrated circuit structure in accordance with the present invention.

Referring to FIG. 1, an integrated circuit is to be formed in a silicon substrate 10. Selected regions of the substrate are oxidized to form an insulating layer of oxide 12. A first layer of photoresist 14 is formed on the integrated circuit by known methods. Photoresist layer 14 will have a thickness of approximately 1.2 microns. Photoresist layer 14 is then patterned and etched by methods known in the art to form a first opening 16. A second photoresist layer 18 is then spun onto the wafer again by known methods covering the first photoresist layer 14 and opening 16. Photoresist layer 18 has a smaller thickness of between approximately 0.1 to 0.5 microns.

Figure 2:
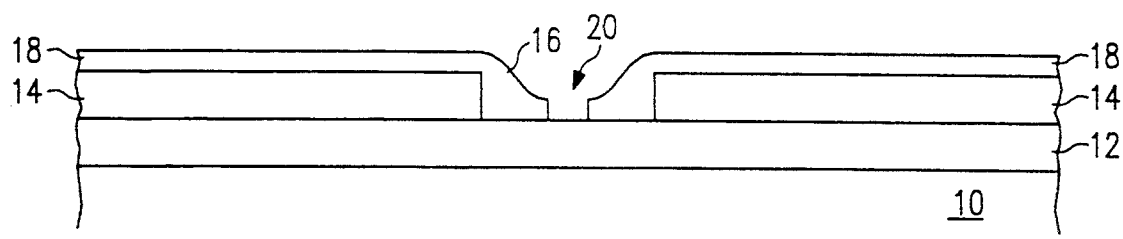

Referring to FIG. 2, photoresist layer 18 is patterned and etched by methods known in the art to form a second opening 20. Opening 20 has a smaller opening than 16 and is inside opening 16. Photoresist coating chemicals used for standard processing may be used for photoresist layers 14 and 18. Also, the chemical composition of photoresist layer 14 may be the same or different than the chemical composition of photoresist layer 18.

Figure 3:
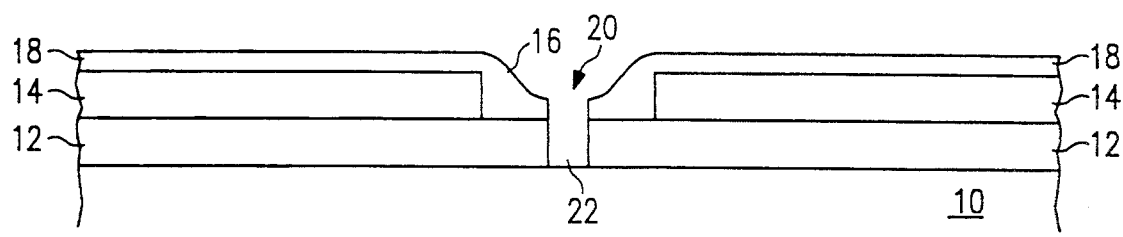

Current process techniques use a combination wet etch and dry etch to form sloped sidewalls on contact holes. Referring to FIG. 3, contact opening 22, however, is etched using a standard dry etch process known in the art. The selectivity of the etchant used will determine the preservation of the substrate surface 10 underlying the oxide layer 12 and the profile of the vertical sides of the contact opening 22 and the remaining photoresist layers 14 and 18. A highly selective etchant will not substantially change the profile or shape of the vertical sides of the contact opening 22 as shown in FIG. 3. Also, the etch rate for the contact opening 22 will be greater than the etch rate of photoresist layer 18 so that the contact opening is etched before the photoresist layer is etched.

Figure 4:
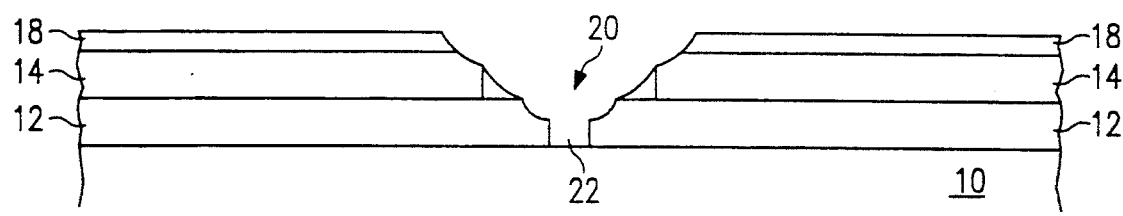

A poorly selective etchant or a non-selective etchant will attack the resist and change the shape or profile of the vertical sides of the contact opening as shown in FIG. 4. The etch rate of the oxide layer 12 will be similar to the etch rate for photoresist layer 18. This anisotropic dry etch will result in an oxide profile similar to the photoresist layer profile.

Figure 5:
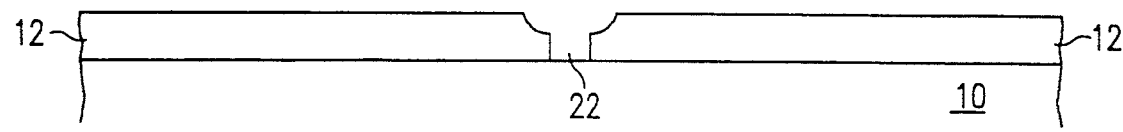

After the contact opening 22 is etched, the remaining photoresist layers 14 and 18 are stripped away using a process known in the art leaving the contact opening 22 through the oxide layer 12 as shown in FIG. 5. The steps described above eliminate the need for wet etching using only a dry etching process while maintaining a desired sloped contact.

Figure 6:
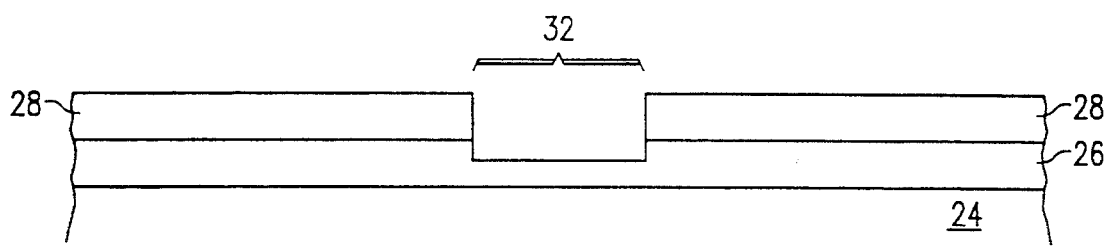

Referring to FIG. 6, an alternative method for producing submicron contacts with unique etched slopes uses an insulating layer as a mask. An integrated circuit is to be formed in a silicon substrate 24. An insulating layer of oxide 26 is formed on the substrate 24. A layer of photoresist 28 is spun onto the integrated circuit by known methods. Photoresist layer 28 will typically have a thickness of approximately 1.2 microns. After photoresist layer 28 is patterned to define a contact opening 32, the portions of the oxide layer 26 exposed through opening 32 is etched. The etch process stops when the oxide layer 26 is partially etched. This etching process will further etch partway through the oxide layer 26. Photoresist layer 28 is then removed by known methods.

Figure 7:
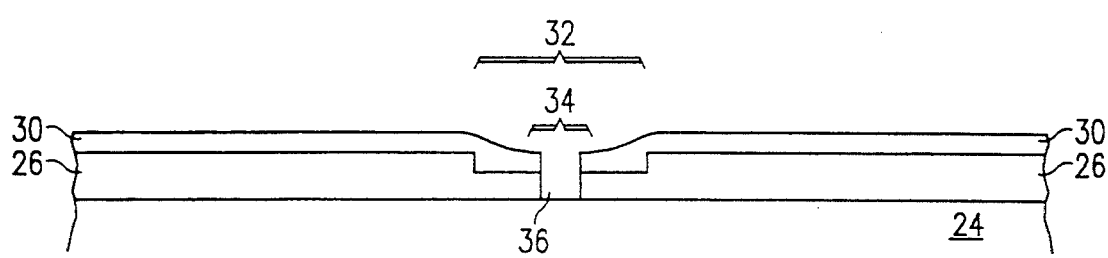

Referring to FIG. 7, a second photoresist layer 30 is then spun onto the wafer by methods known in the art. Photoresist layer 30 is patterned and etched to form a small opening 34 within the larger opening 32. This etching process will etch the remaining way through the oxide layer 26 to form a contact opening 36.

Again, as described above, the selectivity of the etchant used will determine the preservation of the substrate surface 24 underlying the oxide layer 26 and the profile of the vertical sides of the contact opening 36 and the photoresist layer 30. A highly selective etchant will not substantially change the profile of the vertical sides of the contact opening 34 as shown in FIG. 7. The etch rate for the contact opening 34 will be greater than the etch rate of photoresist layer 30 so that the contact opening is etched before the photoresist layer is etched.

Figure 8:
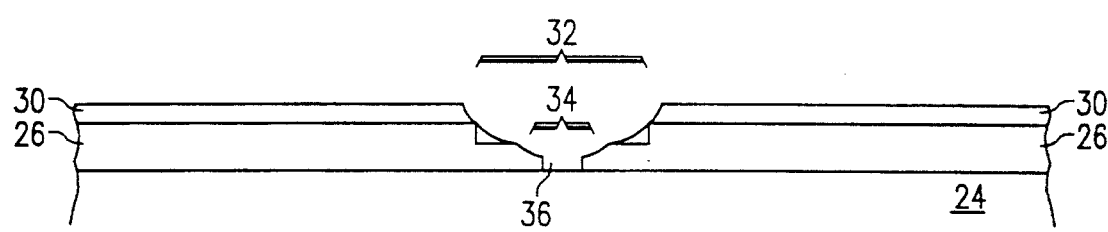
Figure 9:
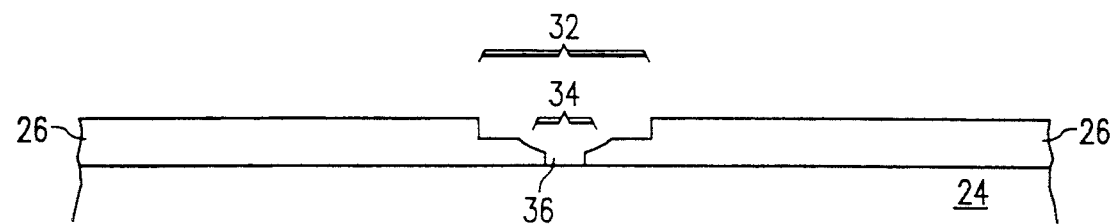

A poorly selective etchant or a non-selective etchant will attack the resist and change the shape or profile of the vertical sides of the contact opening as shown in FIG. 8. The etch rate of the oxide layer 26 will be similar to the etch rate for photoresist layer 30. This anisotropic dry etch will result in an oxide profile similar to the photoresist layer profile. Photoresist layer 30 is then stripped away using a process known in the art leaving the contact opening 36 through the oxide layer 26 as shown in FIG. 9. The anisotropic dry etch process will provide for sloped sidewalls and insure adequate step coverage.

The method described above does not require the use of special photoresist chemicals. The chemical composition of the two layers of photoresist may be the same or may have different compositions. Standard development, etch and exposure tools and techniques may also be used for this process. There is no need for plasma development, X-ray exposures or other special processing. While current process techniques use a combination wet and dry etch to form slopes on contact holes, this process eliminates the wet etch step. Only dry etches are used while maintaining a desired sloped contact. This process can alternatively use the existing device oxide film as a masking barrier instead of a two-tiered photoresist layer. The oxide is patterned and etched and then repatterned and re-etched to form the submicron contacts.

What is claimed is:

1. A method of producing integrated circuit, comprising the steps of:
   forming an insulating layer over the integrated circuit;
   forming a first photoresist layer over the insulating layer, wherein the first photoresist layer has a first thickness;
   forming a first opening through the first photoresist layer;
   forming a second photoresist layer over the first photoresist layer and in the first opening, wherein the second photoresist layer has a second thickness less than the first thickness;
   forming a second opening in the second photoresist layer within the first opening, wherein the second opening is smaller than the first opening; and,
   etching a contact opening in the insulating layer through the second opening.

2. The method of claim 1, wherein the first photoresist layer has a thickness of approximately 1.2 microns.

3. The method of claim 1, wherein the second photoresist layer has a thickness of between approximately 0.1 to 0.5 microns.

4. The method of claim 1, wherein the chemical composition of the first photoresist layer is the same as the chemical composition of the second photoresist layer.

5. The method of claim 1, wherein the chemical composition of the first photoresist layer is different than the chemical composition of the second photoresist layer.

6. The method of claim 1, wherein the step of etching a contact opening etches the insulating layer at a rate at least twice that of the second photoresist layer.

7. The method of claim 1, wherein the step of etching a contact opening etches the insulating layer at a rate less than twice that of the second photoresist layer.

* * * * *